Figure 1:
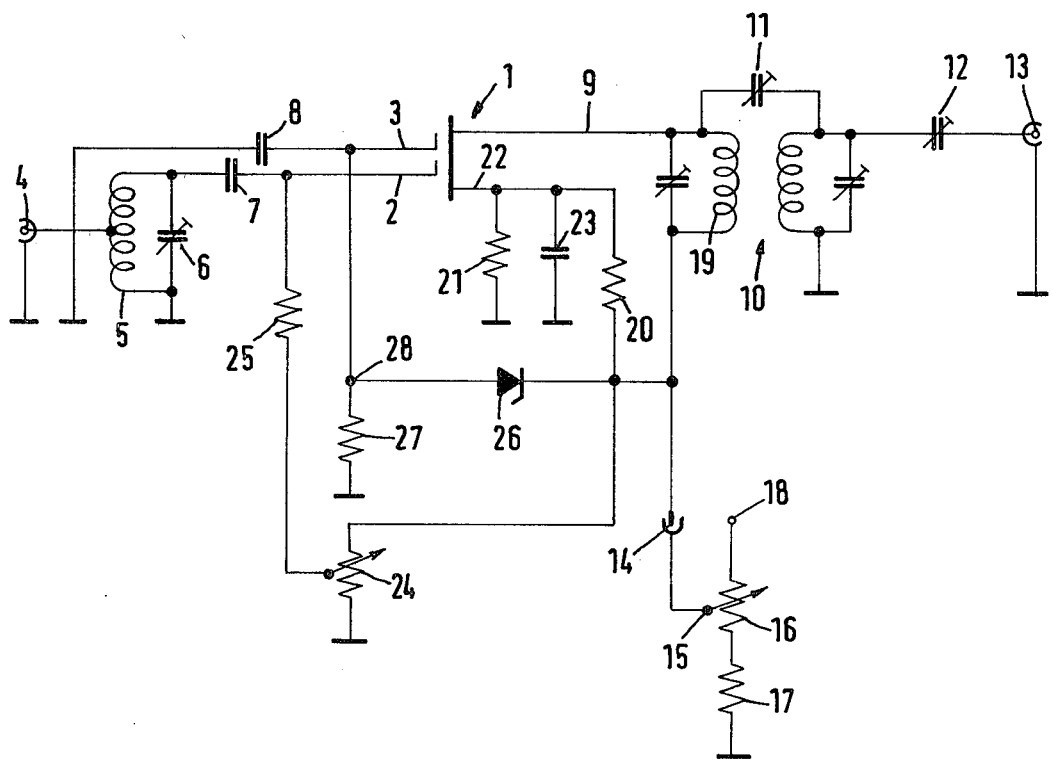

United States Patent [19]

Schürmann

[11] 4,275,361
[45] Jun. 23, 1981

[54] H.F. AMPLIFIER

[75] Inventor: Josef H. Schürmann, Oberhummel, Fed. Rep. of Germany

[73] Assignee: Texas Instruments Deutschland GmbH, Freising, Fed. Rep. of Germany

[21] Appl. No.: 59,793

[22] Filed: Jul. 23, 1979

[30] Foreign Application Priority Data

Jul. 27, 1978 [DE] Fed. Rep. of Germany ....... 2833056

[51] Int. Cl.³ .......................... H03F 3/16; H03G 3/30
[52] U.S. Cl. .................................... 330/277; 330/279
[58] Field of Search ................................ 330/277, 279

[56] References Cited
U.S. PATENT DOCUMENTS 3,480,873  11/1969  Carter ................................. 330/277

Primary Examiner—James B. Mullins
Attorney, Agent, or Firm—Mel Sharp; James T. Comfort; N. Rhys Merrett

[57] ABSTRACT

A dual gate FET has a first gate connected to receive an HF input signal and a second gate which is grounded to HF. The transistor output circuit is connected to a supply voltage terminal. A voltage divider comprising a resistor and a zener diode is connected between the supply voltage terminal and ground, the top of the voltage divider being connected to the second gate electrode. By varying the supply voltage, the amplifier gain can be adjusted. The supply voltage can be adjusted manually by a potentiometer. Alternatively, it can be adjusted automatically according to the strength of the HF input signal so that as the signal strength increases, the gain is reduced. The circuit is amenable to implementation using JFET, IGFET and MESFET transistors.

10 Claims, 5 Drawing Figures

H.F. AMPLIFIER

The invention relates to an HF amplifier comprising a dual-gate field-effect transistor whose first gate electrode receives the HF signal to be amplified, whose second gate electrode is connected to ground as regards high frequencies and whose output circuit is connected to a supply voltage terminal.

HF amplifiers are frequently employed to amplify HF signals received at an antenna prior to their demodulation. If the HF amplifier operates with constant gain it may happen with a particularly large input signal that the circuits fed by the amplifier are overdriven. This can be particularly troublesome when the HF amplifier is used in the input stage of an automobile radio suitable for receiving signals in the VHF range. The aforementioned overdriving can occur when the automobile radio is in the vicinity of the transmitter to which it is tuned because in this case a particularly strong input level is present. To avoid distortions, a gain control signal must therefore be produced in the receiver which in the presence of a high input level reduces the gain of the HF amplifier. This gain control signal must be supplied to the HF amplifier via a separate input line.

The problem underlying the invention is to design an HF amplifier of the type outlined at the beginning so that a change of the gain is made possible without the necessity of a separate line for supplying a control signal.

According to the invention this problem is solved in that the voltage at the supply voltage terminal is adjustable and that to the voltage supply terminal a voltage divider consisting of a zener diode and a resistor is connected, the tap of which is connected to one of the two gate electrodes.

In the HF amplifier according to the invention the change of the gain is achieved in that when the supply voltage of the amplifier changes the voltage at one of the two gate electrodes also changes by the same amount. Thus, for example, if a high input level which would cause distortions in the circuits fed by the amplifier occurs at the amplifier input by changing the supply voltage a reduction of the gain may be effected. To obtain this reduction it is not necessary to provide a separate input line into the amplifier because the terminal to which the supply voltage is applied is utilized directly.

Preferably, according to the invention the zener voltage of the zener diode is equal to half the maximum supply voltage.

In one embodiment of the invention the tap of the voltage divider is connected to the second gate electrode of the field-effect transistor. A further development of the invention resides in that the tap of the voltage divider is connected to the first gate electrode of the field-effect transistor and that the second gate electrode is connected to the tap of an ohmic voltage divider connected to the supply voltage terminal.

According to the invention it is preferably possible to carry out the adjustment of the supply voltage automatically in dependence upon the strength of the HF signal or alternatively manually by adjustment of a potentiometer.

Figure 2:
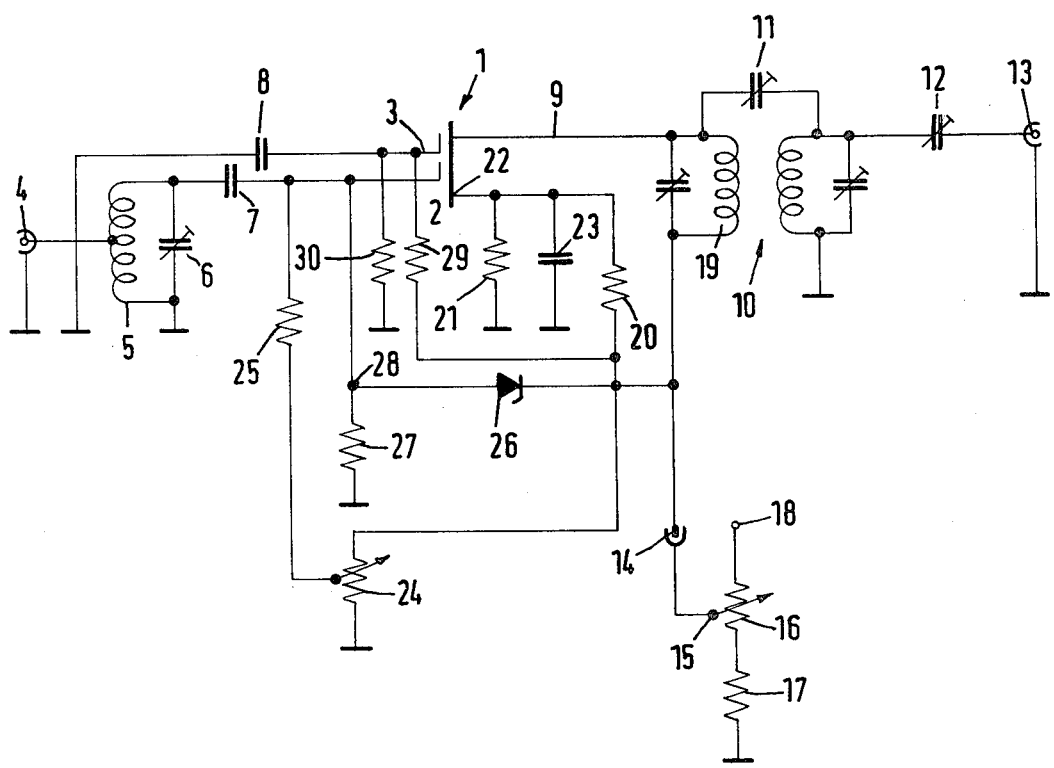
Figure 3:
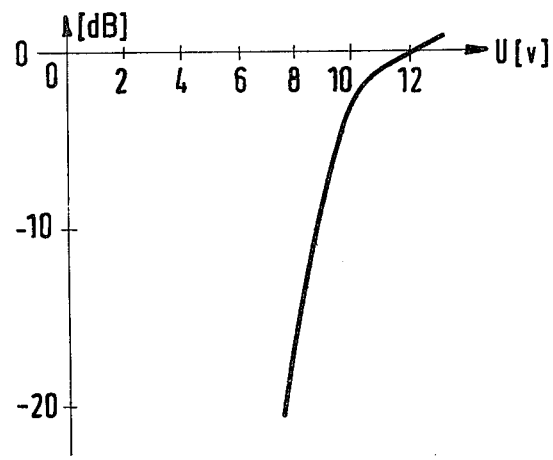
Figure 4:
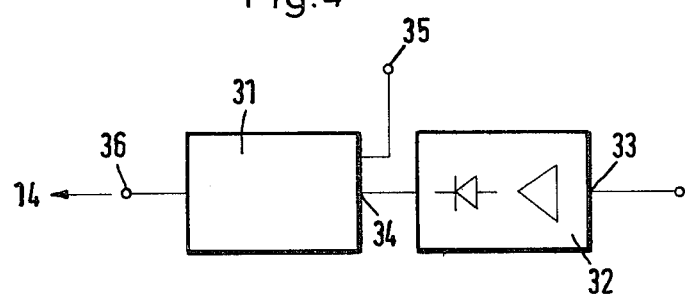
Figure 5:
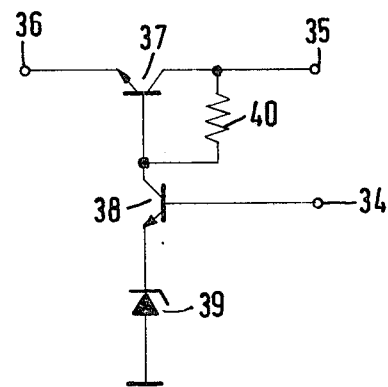

The invention will now be explained by way of example with reference to the drawings, wherein:

FIG. 1 is a circuit diagram of an embodiment of the HF amplifier according to the invention, FIG. 2 is a circuit diagram of another embodiment of the HF amplifier according to the invention, FIG. 3 is a diagram for illustrating the amplification variation of the HF amplifier according to the invention in dependence upon its supply voltage, FIG. 4 is a block circuit diagram of a part of the circuit which when inserted into the HF amplifier according to the invention permits automatic amplification variation in dependence upon the amplifier output signal, and FIG. 5 is an example of a circuit for the voltage adjustment circuit illustrated in FIG. 4.

FIG. 1 shows the circuit diagram of an HF amplifier which may be used for example in the input stage of a radio receiver. The HF amplifer includes as amplifying component an MOS field-effect transistor 1 having two gate electrodes 2 and 3. The high-frequency signal to be amplified is supplied to the input 4 and passes from there to an input filter comprising an inductance 5 and a trimmer capacitor 6. The output of the input filter is connected via a coupling capacitor 7 to the gate electrode 2 of the MOS field-effect transistor 1. The gate electrode 3 of the field-effect transistor is connected for high frequencies to ground via a capacitor 8. The output signal of the MOS field-effect transistor 1 is fed by its drain electrode 9 to an input filter 10 which includes two parallel-resonant circuits coupled via a trimmer capacitor 11 and each containing an inductance and a trimmer capacitor. A trimmer capacitor 12 couples the output signal of the output filter to the amplifier output 13.

Connected to the supply voltage terminal 14 of the HF amplifier is the tap 15 of a voltage divider comprising a potentiometer 16 and a resistor 17 which lies between an operating voltage terminal 18 and ground. Substantially constant operating voltage is applied to the operating voltage terminal 18. The drain electrode 9 of the MOS field-effect transistor 1 is connected for direct current to the supply voltage terminal 14 via an inductance 19 in the output filter 10. Furthermore, a voltage divider consisting of two series-connected resistors 20 and 21 is connected to the supply voltage terminal 14 and the tap thereof is connected to the source electrode 22 of the field-effect transistor. A filter capacitor 23 lies parallel with the resistor 21. Also connected to the supply voltage terminal 14 is a potentiometer 24 which acts as voltage divider and to the tap of which the gate electrode 2 of the MOS field-effect transistor 1 is connected via a resistor 25. Finally, between the voltage supply terminal 14 and ground there is a voltage divider comprising a zener diode 26 and a resistor 27. Connected to the tap 28 of said voltage divider is the gate electrode 3 of the MOS field-effect transistor.

In the amplifier circuit described the supply voltage may be changed by changing the setting of the potentiometer 16. Assuming that the HF amplifier is used in an automobile radio, the usual battery voltage of about 12 V is at the terminal 18. The resistances of the potentiometer 16 and the resistor 17 are selected so that the voltage at the tap 15 can be varied between about 6 V and 12 V. The zener voltage of the zener diode 26 is preferably equal to half the maximum supply voltage assumed to be 12 V in this case, i.e. equal to 6 V. When the maximum voltage of 12 V is at the tap 15 a voltage of 6 V is present at the resistor 27 and thus at the gate electrode 3. When this voltage is at the gate electrode 3 the MOS field-effect transistor 1 has maximum gain defined by the resistors 20, 21 and 24. When the voltage at the supply voltage terminal 24 is reduced the voltage at the resistor 27 also drops and thus at the gate electrode 3 by the same amount because the voltage at the zener diode 26 retains the value of its zener voltage. This is true as long as the voltage at the supply voltage terminal 14 has a value above the zener voltage of the zener diode 26. When the voltage at the supply voltage terminal 14 has a value below the zener voltage the zener diode 26 is non-conductive and as a result the gate electrode 3 is applied to ground. This is then the case of minimum gain of the HF amplifier.

The change of the voltage at the supply voltage terminal 14 of course also has a direct effect via the inductance 19 on the drain electrode 9, via the voltage divider comprising the resistors 20 and 21 on the source electrode 22 and via the potentiometer 24 and the resistor 25 on the gate electrode 2 of the MOS field-effect transistor but this has no appreciable effect on the gain of the field-effect transistor as long as the latter is operating in the saturated condition. The gain would not be influenced until the supply voltage was below 2 V. Only the supply voltage change occurring at the tap 28 of the voltage divider comprising the zener diode 26 and the resistor 27 influences the gain because this voltage changes in the example given in the range from 6 V to 0 V.

The diagram of FIG. 3 indicates the relationship between the gain decrease and the voltage designated by "U" at the supply voltage terminal 14. When the voltage "U" has the maximum value of 12 V the decrease has the value 0 dB which means that the gain has the maximum value. When the voltage "U" is set to lower values a gain reduction occurs which can amount to more than 20 dB when the voltage "U" has half the value of the maximum supply voltage.

When using the HF amplifier described in an automobile radio the gain may be reduced by changing the adjustment of the potentiometer 16 when the radio receives a transmitter with high input level which would lead to overdriving of the stages following the amplifier. This is of great advantage particularly in an automobile radio because when used in this manner the reception conditions are continuously changing and the radio passes through areas which are very close to a transmitter.

However, this possibility of altering the gain is not restricted to the use in an automobile radio but may be applied in all cases where a high input level at the input of the HF amplifier would lead to overdriving in the stages following the amplifier.

A control reduction of the gain is also achieved when the tap 28 is not connected to the gate electrode 3 but to the gate electrode 2 of the field-effect transistor 1 as illustrated in FIG. 2. In this case the gate electrode 3 is connected to the tap of an ohmic voltage divider comprising resistors 29 and 30 which is connected to the supply voltage terminal 14. In this case, a change of the voltage at the supply voltage terminal 14 affects both gate electrodes of the field-effect transistor, giving the desired controlled reduction.

In the circuits of the HF amplifier so far described it has been assumed that the potentiometer 16 must be set via a separate control knob on the apparatus equipped with the amplifier for obtaining the desired gain reduction. It is however also possible to carry out this controlled gain reduction automatically in dependence upon the output level of the HF amplifier without external intervention by the user.

FIG. 4 shows part of a circuit which can be used for obtaining automatic gain reduction instead of the potentiometer 16 and the resistor 17 in the circuits according to FIGS. 1 and 2.

This circuit portion consists of a voltage setting unit 31 and an amplification and demodulation unit 32. The amplification and demodulation unit 32 comprises an input 33 which is connected directly to the amplifier output 13. The amplification and demodulation unit 32 amplifies and demodulates the output signal of the HF amplifier and emits an adjustment signal to the input 34 of the voltage adjustment unit 31. Applied to a further input 35 of the voltage adjustment unit 31 is the operating voltage which in the circuits according to FIGS. 1 and 2 is applied to the terminal 18. The voltage adjustment unit 31 is so designed that in dependence upon the signal at the input 34 it applies to its output 36 in the same manner as the potentiometer 16 to the tap 15 of the circuits according to FIGS. 1 and 2 a voltage which lies in a selected region of the operating voltage at the input 35. When using this circuit portion of FIG. 4 in the circuits according to FIGS. 1 and 2 the output 36 of the voltage adjustment unit 31 is thus connected to the supply voltage terminal 14 to which the tap 15 of the potentiometer 16 is connected in FIGS. 1 and 2.

FIG. 5 shows an example of the makeup of the voltage adjustment unit 31. It contains a transistor 37 whose collector-emitter path lies between the input 35 and the output 36. Between the base of said transistor 37 and ground there lie in series the collector-emitter path of a futher transistor 38 and a zener diode 39. The anode of the zener diode 39 is connected to the emitter of the transistor 38 whilst its cathode is connected to ground. The base of the transistor 38 forms the input 34 of the voltage adjustment unit 31. Between the collector and the base of the transistor 37 there is a resistor 40. With the aid of this circuit, by changing the voltage at the input 34 the voltage at the output 36 can be altered in the same manner as was possible with the potentiometer 15 of the circuits according to FIGS. 1 and 2. The zener voltage of the zener diode 39 is again chosen so that it is equal to half the maximum supply voltage, i.e. is 6 V in the example described; the voltage at the output 36 can be varied between 6 V and 12 V.

In the description of the different embodiments of the invention a MOS field-effect transistor was mentioned as amplifying circuit component. However, instead of this particular type of field-effect transistor any field-effect transistor having two insulated gate electrodes can be used which type of field-effect transistor is usually called dual-gate-IGFET. Moreover, a dual gate junction field effect transistor can be used for example of the type having a pn junction (JFET) or of the type having a Schottky-barrier (MESFET).

What we claim is:

1. High frequency amplifier stage comprising a dual-gate field-effect transistor having a first gate electrode for receiving a high frequency input signal to be amplified, a second gate electrode connected to ground with respect to high freqencies, and an output circuit connected to a supply voltage terminal, voltage divider means comprising zener diode means and resistor means connected to said supply voltage terminal, said voltage divider means having a tap connected to one of the first and second gate electrodes, and means for adjusting a supply voltage connected to said supply voltage terminal for changing the gain of said amplifier stage.

2. High frequency amplifier according to claim 1, wherein said zener diode means has a zener voltage equal to half the maximum suppply voltage adjustable at said supply voltage terminal.

3. High frequency amplifier according to claim 1 or 2, wherein the tap of said voltage divider means is connected to the second gate electrode of said field-effect transistor.

4. High frequency amplifier according to claim 1 or 2, wherein the tap of said voltage divider means is connected to said first gate electrode and said second gate electrode is connected to a tap of further voltage divider means connected between said supply voltage terminal and ground.

5. High frequency amplifier according to claim 1 or 2, including means for adjusting the voltage at the supply voltage terminal automatically in dependence on the strength of said high frequency input signal.

6. High frequency amplifier according to claim 1 or 2, including potentiometer means for manually adjusting the voltage at said supply voltage terminal.

7. High frequency amplifier stage comprising a field-effect transistor having first and second gate electrodes, means for coupling to said first gate high frequency input signals to be amplified, high frequency decoupling means connected between the second gate electrode and ground, said transistor having an output circuit connected to a supply voltage terminal, voltage divider means comprising resistor means connected betweeen one of said first and said second gate electrodes and ground and zener diode means connected between said one gate electrode and said supply voltage terminal, means for automatically adjusting the voltage at the supply voltage terminal to change the gain of said amplifier stage in dependence on the strength of the high frequency input signal, said automatic adjusting means comprising variable conductivity means connected between said supply voltage terminal and a supply voltage source, and control means connected between said output circuit and a control input of said variable conductivity means for changing the conductivity thereof in inverse relation to the strength of the high frequency input signal.

8. High frequency amplifier stage according to claim 7, wherein the control means comprises means for amplifying and demodulating an output signal produced by said output circuit.

9. High frequency amplifier stage according to claim 7 or 8, wherein the variable conductivity means comprises a transistor having a conduction path connected between a voltage supply terminal and said supply voltage source, and means for coupling a control input electrode of said transistor to an output of said control means.

10. High frequency amplifier stage according to claim 9, wherein said coupling means comprises a further transistor having a conduction path connected to said control input electrode and by further zener diode means to ground, said further transistor having a control input electrode connected to the output of said control means.

* * * * *